US010088523B2

(12) United States Patent
Hopkins et al.

(10) Patent No.: US 10,088,523 B2
(45) Date of Patent: Oct. 2, 2018

(54) DEBUG ADAPTER

(71) Applicant: UltraSoC Technologies Limited, Cambridge (GB)

(72) Inventors: Andrew Brian Thomas Hopkins, Folkestone (GB); Andrew James Bower, Cambridge (GB); Michael Jonathan Thyer, Cambridge (GB)

(73) Assignee: UltraSoC Technologies Limited (GB)

( * ) Notice: Subject to any disclaimer, the term of this patent is extended or adjusted under 35 U.S.C. 154(b) by 0 days.

(21) Appl. No.: 15/235,308

(22) Filed: Aug. 12, 2016

(65) Prior Publication Data

US 2017/0045583 A1 Feb. 16, 2017

(30) Foreign Application Priority Data

Aug. 12, 2015 (GB) .................................. 1514299.5

(51) Int. Cl.
G01R 31/317 (2006.01)
(52) U.S. Cl.
CPC .............. G01R 31/31705 (2013.01)
(58) Field of Classification Search
CPC ..................................................... G01R 31/31
USPC .................. 714/724, 32, 30, 38.11, 725, 728
See application file for complete search history.

(56) References Cited

U.S. PATENT DOCUMENTS

| 5,828,824 A * | 10/1998 | Swoboda ......... G01R 31/31705 714/25 |
| 2007/0168746 A1 * | 7/2007 | Righi .................. G06F 11/3656 714/38.11 |
| 2013/0159776 A1 | 6/2013 | Gilday et al. | |
| 2013/0212425 A1 * | 8/2013 | Blaine ................. G06F 11/3648 714/6.1 |

OTHER PUBLICATIONS

UKk Search Report; Application No. GB1514299.5; dated Mar. 15, 2016; 3 pages.

* cited by examiner

*Primary Examiner* — Fritz Alphonse
(74) *Attorney, Agent, or Firm* — Fish & Richardson P.C.

(57) ABSTRACT

An integrated circuit chip comprising system circuitry and debugging circuitry. The system circuitry comprises a peripheral circuit. The debugging circuitry comprises a debug unit and a debug adapter. The debug unit is connected to the peripheral circuit. The debug adapter interfaces between the debug unit and a debug controller. The debug adapter is configured to receive a sequence of debug commands from the debug controller, each debug command instructing the debug unit to perform an action other than responding to a poll. In respect of each debug command, the debug adapter sends the debug command to the debug unit, and polls the debug unit to query whether the debug unit has performed the action instructed in that debug command.

20 Claims, 6 Drawing Sheets

DEBUG ADAPTER

BACKGROUND

This disclosure relates to debugging peripheral circuits, such as processors, on an integrated circuit chip. The disclosure is particularly relevant to debugging peripheral circuits which form part of a System-on-Chip (SoC).

In the past, an embedded system which had multiple core devices (processors, memories etc.) would have been incorporated onto a Printed Circuit Board (PCB) and connected on the PCB via buses. Traffic in the embedded system was conveyed over these buses. This arrangement was convenient for debugging the core devices, because debugging tools such as oscilloscopes and logic analyzers could be attached to the PCB's buses allowing direct access to the core devices.

Market demand for smaller products coupled with advances in semiconductor technology has led to the development of System-on-Chip (SoC) devices. In a SoC, the multiple core devices of an embedded system are integrated onto a single chip. In a SoC, the traffic in the embedded system is conveyed over internal buses, thus connection of debugging tools directly to the system bus is no longer possible. The resulting reduced access coupled with an increasing quantity of data being transported around the chip (due to developments of SoC technology leading to integration of multiple processing cores and higher internal clocking frequencies), has reduced the ability of external debugging tools to find and solve bugs within the system in the timescales demanded by the industry.

Thus, the development of SoC devices required associated development in debugging technology, which lead to the integration of some debug functionality onto the SoC. It is now customary for each core device to have an associated debug unit. Typically, the debug unit can manipulate the operation of the core device (e.g. start/stop the core device), and also collect trace data from that core device. The debug unit operates under the control of an external debug controller. The debug unit transports the trace data it has collected to the external debug controller. The debug controller analyses and manipulates the trace data and other debug information it has received from the debug unit. Following this, the debug controller makes control decisions, for example to change the configuration of the debug unit to collect a different type of data, or to start the core device running again. The debug controller transmits instructions to the debug unit in order to carry out the control decisions it has taken. This set-up is subject to significant latency resulting from the time taken for communications between the debug unit and the off-chip debug controller. This latency limits the efficiency and effectiveness of the debugging process.

SUMMARY OF THE INVENTION

According to a first aspect of this disclosure, there is provided an integrated circuit chip comprising: system circuitry comprising a peripheral circuit; debugging circuitry comprising: a debug unit connected to the peripheral circuit; and a debug adapter for interfacing between the debug unit and a debug controller, the debug adapter being configured to: receive a sequence of debug commands from the debug controller, each debug command instructing the debug unit to perform an action other than responding to a poll; and in respect of each debug command: send the debug command to the debug unit; and poll the debug unit to query whether the debug unit has performed the action instructed in that debug command.

Suitably, the debug adapter is further configured to, in respect of each debug command: receive a poll response from the debug unit; and if that poll response indicates that the debug unit has performed the action, send the next debug command in the sequence of debug commands to the debug unit; whereas if that poll response indicates that the debug unit has not performed the action: repeatedly poll the debug unit to query whether the debug unit has performed the action instructed in that debug command; and on receiving a poll response indicating that the debug unit has performed the action, send the next debug command in the sequence of debug commands to the debug unit.

The debug adapter may comprise a buffer, the debug adapter being configured to: store the sequence of debug commands in the buffer; and in respect of each debug command, on receiving a poll response from the debug unit indicating that the debug unit has performed the action, extract the next debug command in the sequence of commands from the buffer for transmittal to the debug unit.

The debug adapter may be configured to receive the sequence of debug commands in a single communication from the debug controller.

The debug adapter may comprise a memory, the debug adapter being configured to: prior to debugging the system circuitry, receive sequences of debug commands from the debug controller to be pre-loaded to the memory; pre-load the sequences of debug commands to the memory; subsequently receive an instruction from the debug controller to execute a pre-loaded debug command sequence; and extract that pre-loaded debug command sequence from the memory and send the debug commands of that pre-loaded debug command sequence to the debug unit.

The debug adapter may be configured to: whilst debugging the system circuitry, receive a memory update from the debug controller comprising a further debug command sequence to be loaded to the memory; load the further debug command sequence to the memory; and on receiving an instruction from the debug controller to execute the further debug command sequence, extract the further debug command sequence from the memory and send the debug commands of that further debug command sequence to the debug unit.

The debug adapter may comprise a register, the debug adapter being configured to read a data value from the debug unit and store the data value in the register. The debug adapter may be further configured to perform a logical or arithmetic operation on the data value. The debug adapter may be further configured to select a further debug command to send to the debug unit in dependence on the data value.

The debug adapter may be configured to selectively poll the debug unit to query whether the debug unit has performed the action instructed in the debug command in dependence on the debug command type.

The debug adapter may be configured to select not to poll the debug unit following sending a debug command which the debug unit is configured to respond to by sending data to the debug controller.

According to a second aspect of this disclosure, there is provided a method of debugging an integrated circuit chip, the integrated circuit chip comprising system circuitry and debugging circuitry, the system circuitry comprising a peripheral circuit, and the debugging circuitry comprising a debug unit and a debug adapter, the debug unit connected to the peripheral circuit, the debug adapter for interfacing between the debug unit and a debug controller, the method comprising, at the debug adapter: receiving a sequence of debug commands from the debug controller, each debug command instructing the debug unit to perform an action other than responding to a poll; and in respect of each debug command: sending the debug command to the debug unit; and polling the debug unit to query whether the debug unit has performed the action instructed in that debug command.

BRIEF DESCRIPTION OF THE DRAWINGS

The present disclosure will now be described by way of example with reference to the accompanying drawings. In the drawings.

DETAILED DESCRIPTION

The following disclosure describes a debug architecture suitable for implementation on a SoC or an MCM.

Figure 5:
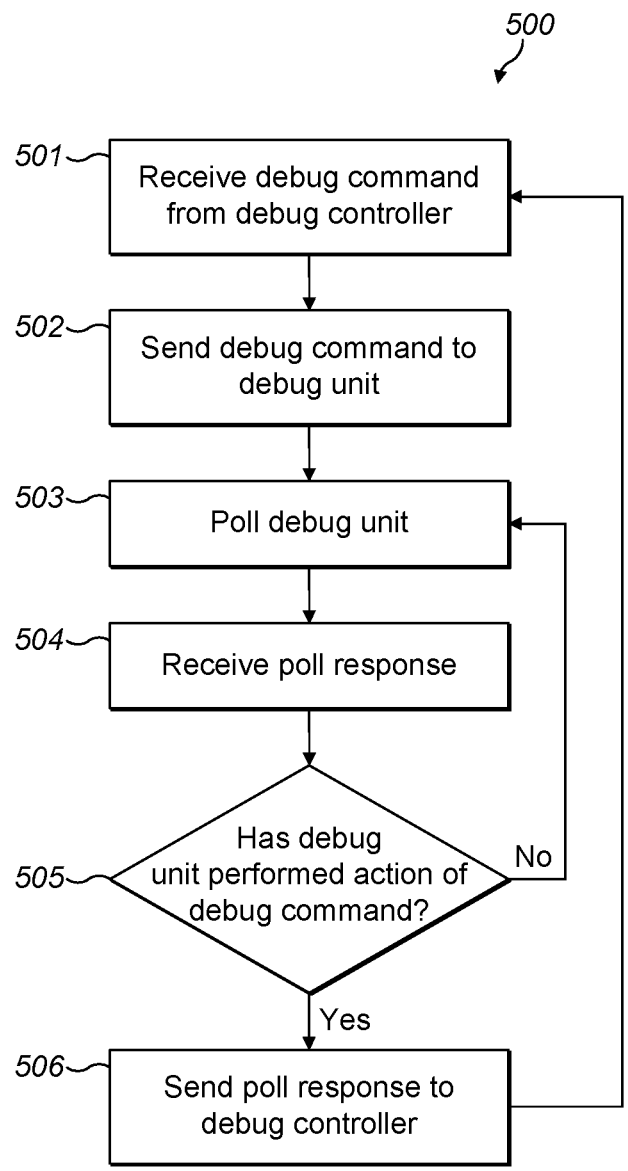
FIG. 5 is a flowchart illustrating a debugging method performed at a debug adapter.
Figure 6:
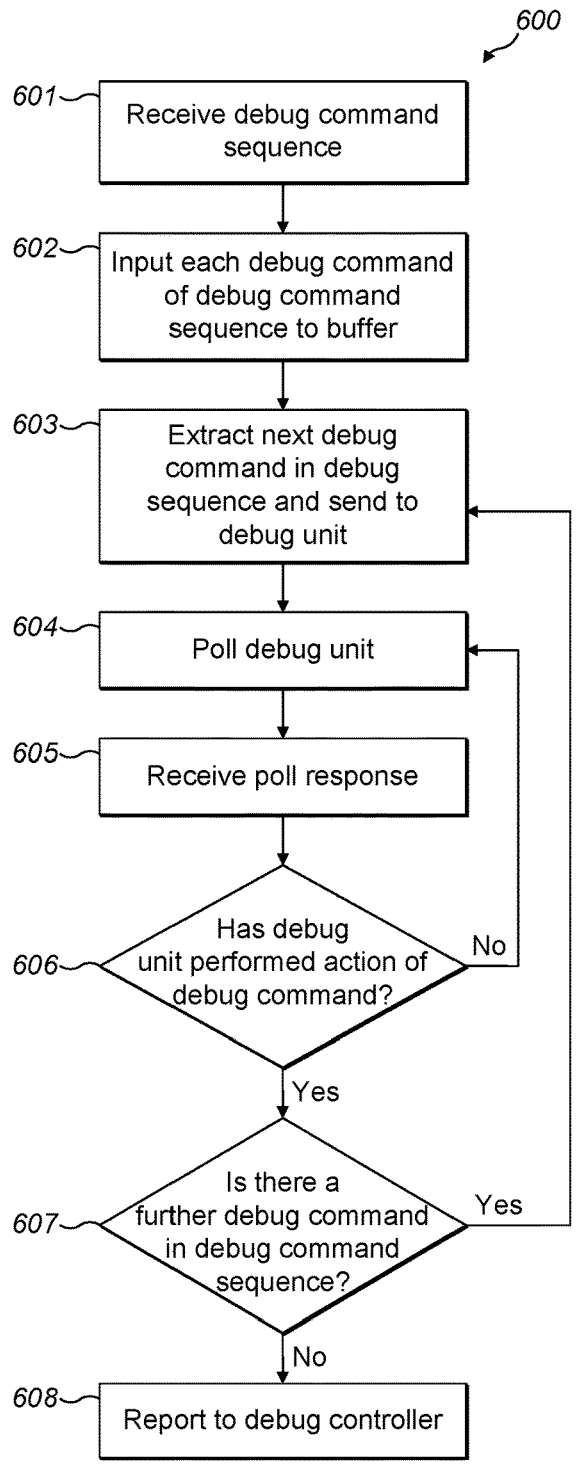
FIG. 6 is a flowchart illustrating a further debugging method performed at a debug adapter.
Figure 7:
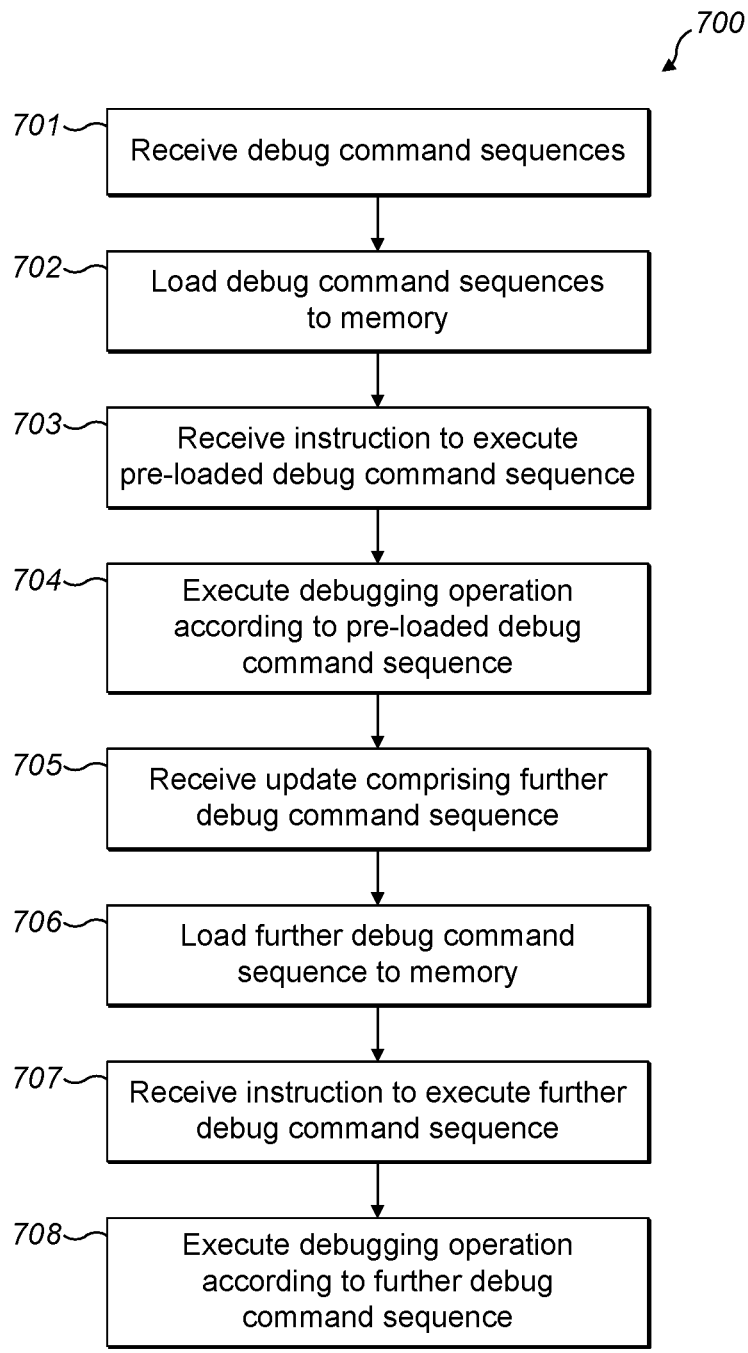
FIG. 7 is a flowchart illustrating a method of loading debug command sequences to a debug adapter.

FIGS. 1 to 4 are schematic diagrams of exemplary debug architectures, and components within debug architectures. These figures present the structures in terms of functional blocks. Some functional blocks for carrying out functions well known in the art have in places been omitted from these figures. FIGS. 5, 6 and 7 are flowcharts illustrating debug methods implemented at a debug adapter. Each flowchart depicts an order in which the method of that flowchart can be performed. However, the flowcharts are not intended to restrict the described methods to being implemented in the orders depicted. The steps of the methods may be carried out in alternative orders to those depicted in the flowcharts.

Figure 1:
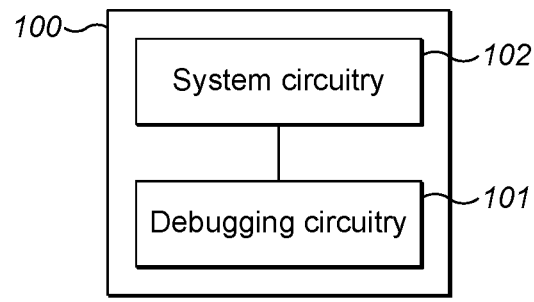
FIG. 1 is a schematic drawing of an exemplary debug architecture on an integrated circuit chip device.
Figure 2:
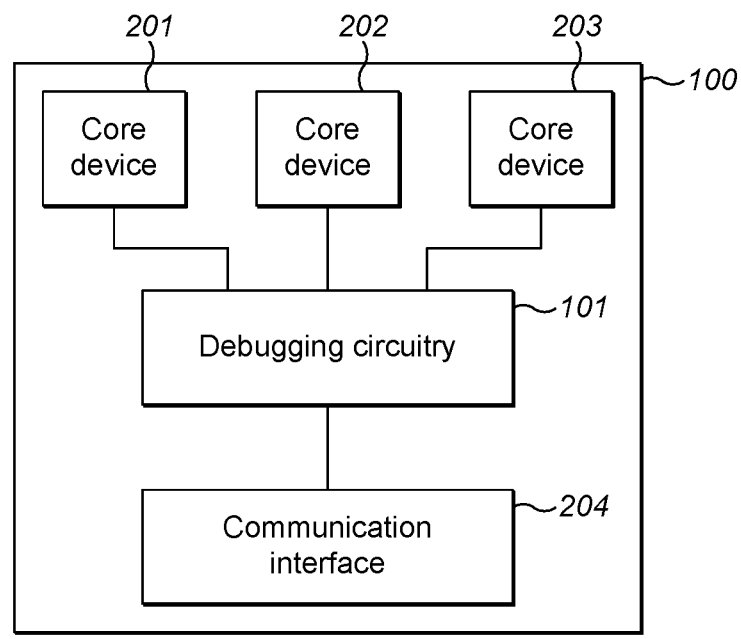
FIG. 2 is a schematic drawing of an exemplary debug architecture on an integrated circuit chip device.

FIG. 1 illustrates the general structure of an exemplary debug architecture for a SoC 100. Debugging circuitry 101 is arranged to debug system circuitry 102. FIG. 2 illustrates exemplary system circuitry comprising core devices and a communication interface. The core devices 201, 202 and 203 of the SoC are peripheral circuits to the debugging circuitry, each of which is connected to the debugging circuitry 101. Although FIG. 2 illustrates three core devices, any number of core devices can be suitably integrated into the debug architecture. Exemplary core devices include a DSP (digital signal processor), video processor, applications processor or CPU (central processor unit), graphics processor, system memory, bus, system interconnect, RTOS (real-time operating system), software, data, custom circuit and a data engine. However, any component of a SoC is suitable for being incorporated into the debug architecture as a core device on FIG. 2. The core devices may be emulators or simulators of other devices on the chip. For example, a core device may emulate a processor.

The debugging circuitry is able to manipulate the operation of the core devices and monitor the operation of the core devices. The debugging circuitry is connected to a communication interface 204. Communication interface 204 may be configured to communicate with entities off-chip. For example, debugging circuitry 101 may communicate with an off-chip debug controller via communication interface 204. Communication interface 204 may also be configured to communicate with other entities on-chip. For example, debugging circuitry 101 may communicate with an on-chip debug controller via communication interface 204. Although FIG. 2 illustrates one communication interface, any number of communication interfaces can be integrated onto the SoC. The communication interfaces implemented are chosen in dependence on the type of connections that are to be made. Exemplary communication interfaces include: traditional debug interfaces such as JTAG, parallel trace input/output, and Aurora based high-speed serial interface; and reuse of system interfaces such as USB, Ethernet, RS232, PCIe and CAN.

Figure 3:
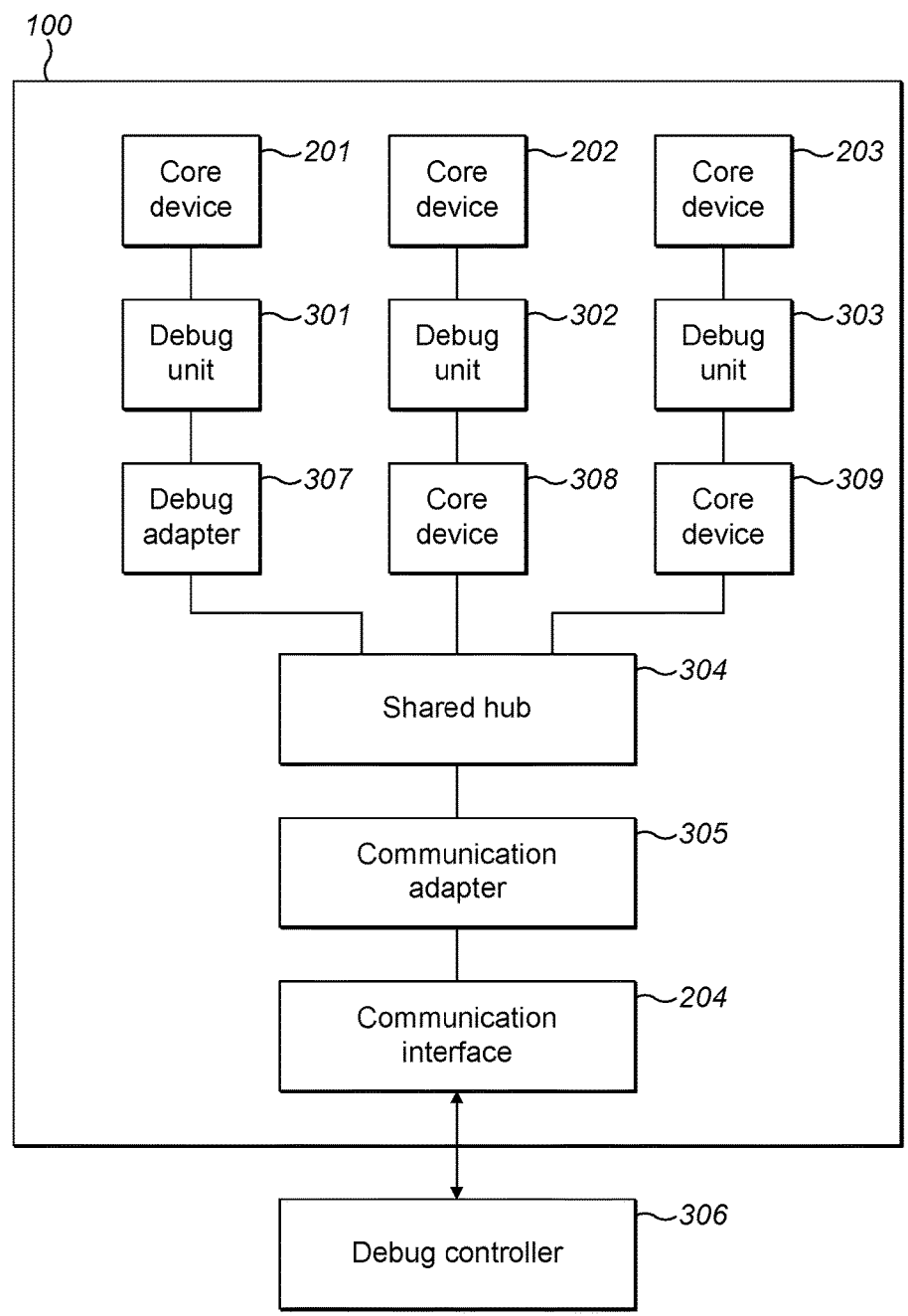
FIG. 3 is a schematic drawing of an exemplary debug architecture comprising a shared hub.

The structure of the debugging circuitry is implementation-dependent. FIG. 3 illustrates an example in which the debugging circuitry comprises a shared hub 304, debug units 301, 302, 303, a communication adapter 305, and debug adapters 307, 308, 309. In FIG. 3, each core device 201, 202, 203 of the SoC is respectively connected to its own debug unit 301, 302, 303. The debug units may be configured to passively or actively observe the attached core device. A debug unit which passively observes a core device is limited to analysing the output of that core device. Conversely, a debug unit which actively observes a core device may analyse the output of the core device, and additionally may control the core device to modify its operation. For example, the debug unit may control the core device to slow down the speed at which the core device operates or to stop, start or step (i.e. execute one instruction) a processor of the core device. The debug unit may instruct the core device to perform the operation immediately. Alternatively, the debug unit may instruct the core device to perform the operation in response to a condition having been met, for example a program address having been reached, a data address having been accessed, or a trigger stimulus having been received from outside the processor circuit. The debug unit may also read parts of the core device's state. For example, the debug unit may read the configuration of parts of a processor at the time that the processor was stopped by the debug unit. The debug unit may modify the state of the core device.

The communication interface 204 is connected to a communication adapter 305. The communication adapter adapts signals that it receives to a format that is suitable for the communication interface that it is connected to. The communication interface 204 communicates signals to an off-chip debug controller 306. Each debug unit and the communication adapter is connected to a shared hub 304. Shared hub 304 routes signals between the devices on the chip. For example, the shared hub routes messages between the debug units. The shared hub also routes messages between the communication adapter and the debug units. The shared hub may also comprise resources which are shared between the debug units. For example, the shared hub may comprise a shared buffer for use by the debug units. By locating such resources in the shared hub as opposed to in the debug units, the debug units are made smaller and hence can be more easily integrated across the chip.

Figure 4:
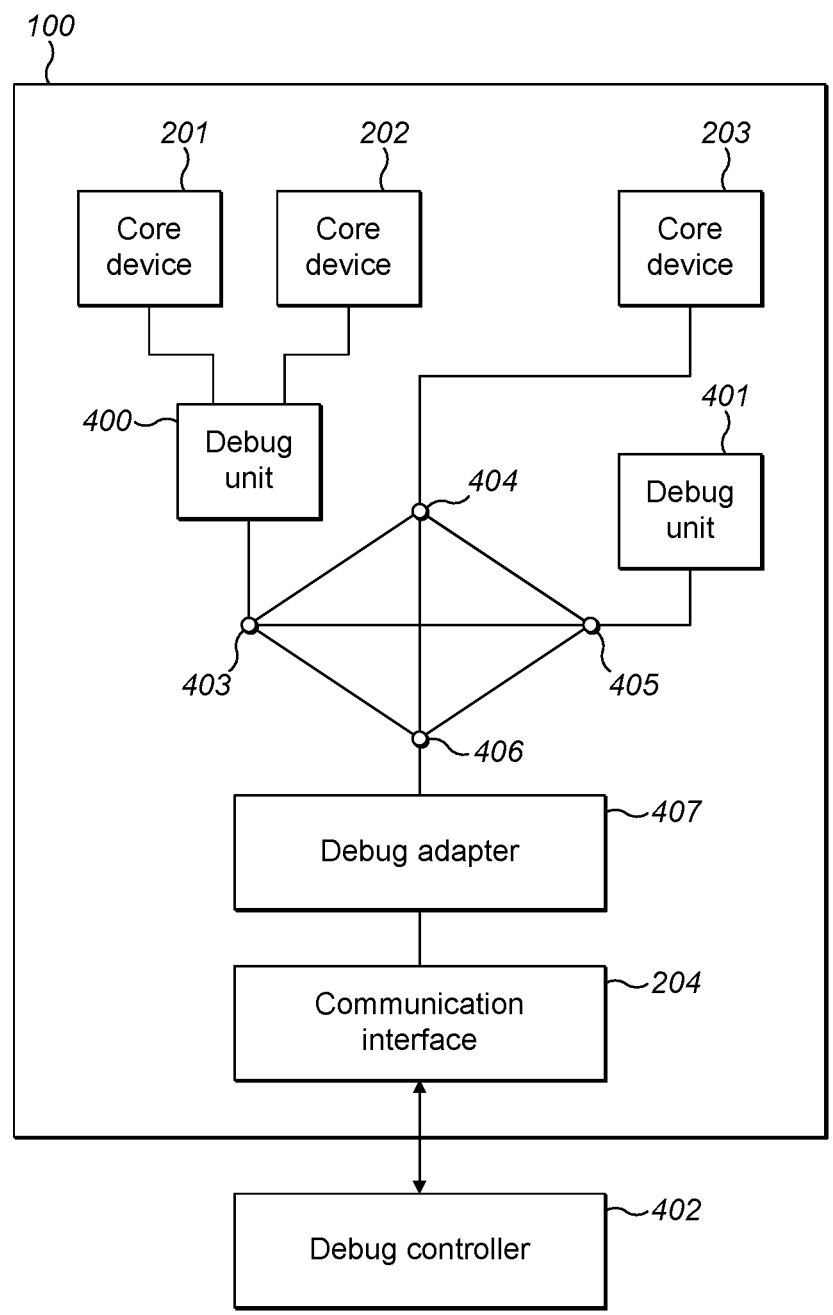
FIG. 4 is a schematic drawing of an exemplary debug architecture comprising a mesh network.

FIG. 4 illustrates another exemplary structure of the debugging circuitry which comprises a mesh network of nodes 403, 404, 405, 406 and debug units 400, 401. In FIG. 4, core devices 201 and 202 are both connected to the same debug unit 400. Core device 203 is not directly connected to a debug unit. Debug unit 401 is connected to node 405 of the mesh network, but not directly connected to a core device. Debug adapter 407 is not directly connected to a debug unit. Debug adapter 407 is connected to debug units 400 and 401 via the mesh network. The communication interface 204 communicates signals to an off-chip debug controller 402. The mesh network of nodes routes messages between the components of the SoC.

The debugging circuitry may comprise other types of interconnection for routing messages between components of the SoC. For example, the debugging circuitry may comprise a bus network such as the Advanced Peripheral Bus or Advanced High-performance Bus. The debugging circuitry may comprise a ring network. Alternatively, the debugging circuitry may comprise any combination of one or more shared hubs, buses, ring networks and mesh networks.

The debugging circuitry comprises one or more debug units. A debug unit may be directly connected to a core device (as shown in FIG. 3). A debug unit may be directly connected to more than one core device (as shown in FIG. 4). A debug unit may be not directly connected to a core device, but connected to the interconnection of the debugging circuitry (as shown in FIG. 4).

The debugging circuitry comprises one or more debug adapters. A debug adapter may be directly connected to a debug unit (as shown in FIG. 3). A debug adapter may be directly connected to more than one debug unit (as shown in FIG. 4). A debug adapter may be not directly connected to a debug unit, but connected to the interconnection of the debugging circuitry (as shown in FIG. 4). A debug adapter may be directly connected to the communication interface 204 (as shown in FIG. 4).

Suitably, the debugging circuitry is controlled by a debug controller. As described above, the debug controller may be located off-chip or on-chip. An alternative configuration may be implemented in which both an on-chip and an off-chip debug controller are used. In this situation, the off-chip debug controller is the dominant controller, in other words it acts as a master to the on-chip debug controller.

The off-chip debug controller 306, 402 comprises a debugger (hardware unit) and a debug agent (software unit). Either or both of these may be located on a debug host computer. The debug host computer may be directly connected by cable to the communication interface 204 at the chip boundary, for example via a USB connection. Alternatively, the debug host computer may be connected to the communication interface 204 via a debug probe.

Suitably, the components of the debugging circuitry communicate using debug messages. These messages may be assembled into packets for transporting through the integrated circuit chip. The debug messages may contain control information to control the operation of part of the debugging circuitry or system circuitry. Alternatively, the debug messages may contain debug data. For example, the debug data may be trace data. Trace data is the output of a component of the system circuitry which a debug unit has recorded passively whilst that component of the system circuitry continues executing. The trace data may be program traces or data traces. As another example, the debug data may be the state of a component of the system circuitry or the state of a component of the debugging circuitry. For example, the debug data may be a state of a performance counter. Performance counters may be used to count a variety of events from system circuitry, such as signal edges, clock cycles a signal is high or low for, time spent in a given operational state, time a register is at a specific value or within a prescribed range, or error conditions. This type of debug data may be used to infer the state or operation of part of the system circuitry, or to identify whether specific events have or have not occurred.

The debugging circuitry implements a debugging procedure under the control of the debug controller. The following lists the steps implemented at the debug controller in respect of an exemplary portion of a debugging procedure:

1. Send command to stop processor
2. Poll to check if processor has stopped
3. Receive poll response confirming processor has stopped
4. Send command to read a debug register within the debug unit
5. Poll to check if debug register read
6. Receive poll response confirming debug register read
7. Extract read data
8. Send command to processor to execute an instruction to manipulate the processor's registers
9. Poll to check if instruction executed
10. Receive poll response confirming instruction executed
11. Send command to read processor register from processor
12. Poll to check if processor register read
13. Receive poll response confirming processor register read
14. Extract read data
15. Manipulate data read from the processor register
16. Send command to write new data to the processor register
17. Poll to check if data written to processor register
18. Receive poll response confirming data written to processor register
19. Send command to processor to execute an instruction to manipulate the processor's registers
20. Poll to check if instruction executed
21. Receive poll response confirming instruction executed
22. Send command to restore the first processor register read from the processor
23. Poll debug register to check if first processor register restored
24. Receive poll response indicating first processor register restored Each step may be an aggregate operation, for example comprising multiple operations on debug registers. This sequence comprises many stages of polling. Each time the debug controller polls the debugging circuitry, it waits for a poll response confirming that the associated action has been completed before moving onto the next command. The repeated polling of the debugging circuitry is a main cause of latency in the debugging procedure.

The example sequence itemised above is for a small debug task. Typically, debug tasks require complicated sequences of interactions in order to complete them. The interactions may be dependent on the state of the core device and on the state of the debug unit of the core device. A typical high level debug operation involves several sequences of debug commands, each sequence corresponding to an assembled debug instruction to be executed. Taking the example of reading a processor status register, the processor's state is generally not directly accessible by the debug controller. The processor's state is generally visible only within the processor's vendor specific model. To read the processor state, the debug controller causes the processor to execute instructions that cause data to be transferred to or from a coprocessor register via general purpose registers. The coprocessor register is accessible by a debug unit. Many polling steps are utilised to ensure that values have been correctly saved to the coprocessor register. Additionally, many steps are utilised to ensure that the values already in the general purpose registers are saved at the beginning of the process and restored at the end when normal program execution continues.

The debugging circuitry described herein comprises one or more debug adapters located on-chip. For ease of description, the following refers to a single debug adapter performing a debug operation in concert with a single debug unit and core device. That description will be understood to extend to multiple debug adapters, each performing debug operations on one or more debug unit and associated core device(s). The debug adapter interfaces between the other on-chip debugging circuitry and the debug controller. As described further below, the debug adapter is configured to perform functions which result in the number of control decisions implemented by the off-chip debug controller being reduced. The use of the debug adapter also reduces the waiting time between consecutive commands being received at the debug unit.

FIG. 5 illustrates an exemplary method implemented at a debug adapter which receives a debug command sequence from an off-chip debug controller intended for a debug unit. At step 501, the debug adapter receives a debug command from the debug controller. At step 502, the debug adapter sends the debug command to the debug unit. The debug adapter may reformat the debug command before forwarding it to the debug unit. For example, the debug adapter may assemble a debug instruction from several received packets and repackage the assembled instruction into debug messages suitable for sending to the debug unit. The debug adapter may receive a high level request from the debugger, for example a request to stop, start or step the processor, or a request to read or write to a register, or a request to read or write a program counter. The debug adapter converts this high level request to debug instructions for the debug unit to carry out.

At step 503, the debug adapter polls the debug unit. The poll message sent by the debug adapter to the debug unit queries whether the action instructed in the debug command has been completed by the debug unit. At step 504, the debug adapter receives a poll response from the debug unit. At step 505, the debug adapter determines whether the debug unit has performed the action instructed in the debug command. The debug adapter performs this step with reference to the poll response. The poll response indicates either (i) that the debug unit has performed the action instructed by the debug command, or (ii) that the debug unit has not yet performed the action instructed by the debug command.

The poll message may be in the form of a request for the debug unit state, and the poll response message may be in the form of an indication of the debug unit state. In this case, the debug adapter analyses the state of the debug unit in order to determine whether the action instructed by the debug command has been implemented. The debug adapter may do this by comparing the current debug unit state received in the poll response message to the previous debug unit state stored at the debug adapter. If those two states are different, the debug adapter may then infer that the debug unit has implemented the action instructed by the debug command. The poll message may be a request to read a debug register of the debug unit, and the poll response the read data from the debug register. Bits in that debug register may take one value prior to a command having been executed and another value after the command has been executed. They may take a further value to indicate that a command is in progress. If those bits have been cleared or set (or whatever value is appropriate in the protocol in operation) then the debug adapter infers that the debug command has been completed. The debug registers may be data transfer registers. If the status of a debug transfer register is empty this may indicate a command has been executed, whereas if it is full this may indicate that the command is in progress. The poll message may be a monitoring of signal transitions on a bus. The debug unit may be configured to assert or deassert a bus signal on completing the debug command. The debug adapter infers that the debug command has been completed from whether the signal is asserted or deasserted, or from whether a signal transition has occurred. For example, when a processor is halted a signal may be asserted on a bus. Thus, by detecting that the halt signal is asserted, the debug adapter infers that the debug command to halt the processor has been completed.

If at step 505 the debug adapter determines that the debug unit has completed the action instructed by the debug command, then, at step 506, the debug adapter sends a poll response to the debug controller. The poll response that the debug adapter sends to the debug controller confirms that the action instructed by the debug command has been completed. The debug adapter then receives the next debug command in the debug command sequence from the debug controller and performs the method of FIG. 5 with that next debug command. If at step 505 the debug adapter determines that the debug unit has not yet completed the action instructed by the debug command, then the debug adapter returns to step 503 and polls the debug unit again to query whether the action has now been completed. The debug adapter may be configured to wait for a time period T before polling the debug unit again. The time period T may be preset. The time period T may be dynamically configurable. The time period T may be increased in response to high data traffic on the debugging circuitry interconnections. The time period T may be increased in response to the chip or the debugging circuitry on the chip entering a low power mode. The debug adapter continues through cycles of polling the debug unit and receiving a poll response until a pole response indicates that the debug unit has performed the action instructed by the debug command. Once the debug unit responds to a poll indicating that it has performed the action instructed by the debug command, the debug adapter sends a poll response to the debug controller (506) and awaits receipt of the next debug command from the debug controller (501).

The debug adapter runs through the method of FIG. 5 with each subsequent command until the debug command sequence is completed.

Thus, FIG. 5 illustrates a method in which the debug adapter is configured to automatically poll the debug unit after having forwarded the debug unit a debug command from the debug controller. Thus, the debug controller no longer needs to send poll messages to the debug unit. Since the debug adapter is located on-chip, by having the debug adapter poll the debug unit without requiring an instruction from the debug controller to do so, this reduces latency in the debugging procedure.

Implementing the method of FIG. 5 in respect of the debugging procedure listed above reduces the steps implemented at the debug controller to the following:

1. Send command to stop processor
2. Receive confirmation processor has stopped

3. Send command to read a debug register within the debug unit
4. Receive confirmation debug register read
5. Extract read data
6. Send command to processor to execute an instruction to manipulate the processor's registers
7. Receive confirmation instruction executed
8. Send command to read processor register from processor
9. Receive confirmation processor register read
10. Extract read data
11. Manipulate data read from the processor register
12. Send command to write new data to the processor register
13. Receive confirmation data written to processor register
14. Send command to processor to execute an instruction to manipulate the processor's registers
15. Receive confirmation instruction executed
16. Send command to restore the first processor register read from the processor
17. Receive indication from debug register that first processor register restored The debug adapter may poll the debug unit following every debug command that the debug adapter sends to the debug unit. Alternatively, the debug adapter may selectively poll the debug unit. For example, the debug adapter may decide whether to poll the debug unit in respect of a debug command in dependence on the type of the debug command. The debug command type may be indicated in the header of the debug command received from the debug controller. Alternatively, the debug adapter may determine the debug command type by reading the payload of the debug command. The debug adapter may hold a register which specifies which debug command types to poll in respect of and which debug command types to not poll in respect of. The debug adapter compares the debug command type to the register, and selects to poll or not poll in respect of that debug command in accordance with the register. Alternatively, the debug controller may include a flag in the header of the debug command. This flag may indicate to the debug adapter to poll the debug unit or not poll the debug unit.

Examples of debug commands which the debug adapter sends to the debug unit and does select to subsequently poll the debug unit in respect of are debug commands which instruct the debug unit to manipulate a core device. For example, if the debug command instructs the debug unit to read, write or modify a processor register, or start, stop or step a processor. Examples of debug commands which the debug adapter sends to the debug unit and selects to not subsequently poll the debug unit in respect of are debug commands which instruct the debug unit to perform an action which involves sending data to the debug controller. For example, extracting data and sending it to the debug controller.

The debug adapter may not receive a poll response at step 504. The debug adapter may be configured to abort the polling method in respect of that debug command in the case that the debug unit is unresponsive to the poll message sent at step 503. For example, the debug adapter may be configured to wait for a poll response for a time period. On expiry of that time period, the debug adapter aborts the polling method for that debug command. The time period may be predetermined. The time period may be run-time programmed. Alternatively, the debug controller may send a control signal to the debug adapter to cause the debug adapter to abort the polling method in respect of that debug command. The debug controller may send this control signal in response to the debug adapter sending a message to the debug controller to indicate that no poll response has been received. Alternatively, the debug controller may send this control signal to the debug adapter if the debug controller has not received a poll response from the debug adapter after a time period after sending the debug command to the debug adapter. This time period may be predetermined. This time period may be run-time programmed. When an abort occurs, the debug adapter sends a notification message of the abort to the debug controller. The debug controller then knows that the command has failed. The debug controller may respond by instructing a recovery command sequence. The debug controller may output the command failure to a user interface.

In an exemplary implementation, the debug adapter further comprises a buffer for storing a sequence of debug commands. This enables the debug adapter to receive more than one debug command at a time from the debug controller. The debug adapter stores the future debug commands whilst processing the current one. FIG. 6 illustrates an exemplary method implemented at a debug adapter which receives a debug command sequence all in one single communication from the off-chip debug controller as a single command block intended for a debug unit.

At step 601, the debug adapter receives a debug command sequence from the debug controller in a single communication from the debug controller. At step 602, the debug adapter inputs each debug command of the debug command sequence to the buffer. At step 603, the debug adapter extracts the first debug command from the buffer and sends it to the debug unit. As described in respect of FIG. 5, the debug adapter may reformat the debug command prior to forwarding it to the debug unit.

At step 604, the debug adapter polls the debug unit. The poll message sent by the debug adapter to the debug unit queries whether the action instructed in the debug command has been completed by the debug unit. At step 605, the debug adapter receives a poll response sent from the debug unit. At step 606, the debug adapter determines whether the debug unit has performed the action instructed in the debug command. This may be done as described with reference to FIG. 5.

If the debug adapter determines that the debug unit has not yet completed the action instructed by the debug command, then the debug adapter returns to step 604 and polls the debug unit again to query whether the action has now been completed. As described with reference to FIG. 5, the debug adapter may wait a time T prior to polling the debug unit again. If at step 606, the debug adapter determines that the debug unit has completed the action instructed by the debug command, then at step 607, the debug adapter determines if there is a further debug command in the debug command sequence. The debug adapter may do this by assessing if there is another debug command of that debug command sequence stored in the buffer. The debug adapter may make this assessment by attempting to retrieve the next command from the buffer. If the debug adapter determines that there is a further command in the debug command sequence, then the method returns to step 603 and the debug adapter extracts the next debug command from the buffer and sends it to the debug unit.

The debug adapter runs through the method of FIG. 6 with each subsequent command until the debug command sequence is completed, and hence the answer to step 607 is no. The debug adapter then generates and sends a report to the debug controller at step 608. This report confirms that the debug command sequence has been completed. In other words, this report confirms that the actions instructed by the debug command sequence have been implemented.

The debug controller may in response to receiving the report of step 608 then send the next debug command sequence to the debug adapter. Alternatively, the debug controller may have already sent the next debug command sequence to the debug adapter prior to receiving the report from the debug adapter. The debug controller may send multiple debug command sequences to the debug adapter all in a single communication. The debug adapter may receive the multiple debug command sequences and store them in the buffer. Having completed a debug command sequence, the debug adapter may be configured to immediately start sending the next debug command sequence to the debug unit.

The method of FIG. 6 enables the debugging operation to occur more quickly because the debug adapter does not need to wait for the next debug command to be received from the debug controller after receiving a positive poll response from the debug unit. Instead, on receiving a positive poll response from the debug unit, the debug adapter can immediately send the next debug command in the debug command sequence.

The method of FIG. 6 reduces the number of communications between the debug adapter and the debug controller per debugging procedure. This is because, the debug adapter does not send poll responses to the debug controller following every positive poll response that it receives from the debug unit. Instead, the debug adapter waits until the whole debug command sequence has been completed by the debug unit before sending a report to the debug controller confirming that the actions instructed by the debug command sequence have been implemented.

Implementing the method of FIG. 6 in respect of the debugging procedure listed above further reduces the steps implemented at the debug controller to the following:
1. Send command to stop processor
2. Send command to read a debug register within the debug unit
3. Extract read data
4. Send command to processor to execute an instruction to manipulate the processor's registers
5. Send command to read processor register from processor
6. Extract read data
7. Manipulate data read from the processor register
8. Send command to write new data to the processor register
9. Send command to processor to execute an instruction to manipulate the processor's registers
10. Send command to restore the first processor register read from the processor
11. Receive confirmation debug command sequence completed FIG. 7 illustrates another exemplary implementation in which the debug adapter comprises a programmable memory which the debug controller pre-loads with sequences of debug commands prior to debugging the system circuitry. At step 701, prior to initiating any debug procedures, the debug controller sends a plurality of debug command sequences to the debug adapter which the debug adapter receives. Suitably, these are commonly used debug command sequences. At step 702, the debug adapter pre-loads the plurality of debug command sequences into the memory.

The debug controller subsequently initiates a debugging procedure. The debug controller sends an instruction to the debug adapter to execute one of the pre-loaded debug command sequences which the debug adapter receives at step 703. In response, at step 704, the debug adapter extracts the pre-loaded debug command sequence from the memory and executes a debugging operation in accordance with that debug command sequence. Suitably, step 704 is implemented as described with reference to steps 603 to 608 of FIG. 6.

At some point after the debugging circuitry has been debugging the system circuitry, the debug controller may send a memory update to the debug adapter comprising one or more further debug command sequences to be loaded into the debug adapter's memory. This may happen, for example, if the debug controller determines to execute an infrequently occurring debug operation which had not yet been stored in the debug adapter's memory. The debug adapter receives the memory update request at step 705 and responds by loading the further debug command sequence into the memory at step 706.

The debug controller may then send an instruction to the debug adapter to execute the further debug command sequence. The debug adapter receives this instruction at step 707 and, at step 708, executes a debugging operation in accordance with the further debug command sequences. Suitably, step 708 is implemented as described with reference to steps 603 to 608 of FIG. 6.

The method of FIG. 7 reduces the number of communications between the debug adapter and the debug controller. This is because the debug controller does not send a debug command sequence to the debug adapter every time that that debug command sequence is to be implemented. Instead, the debug controller sends the debug command sequence to the debug adapter once, and then subsequently just sends an instruction to the debug adapter to implement that debug command sequence.

The debug adapter may additionally perform direction manipulation of data values retrieved from the debug unit. For example, the debug adapter may read a data value from the debug unit and store the data value in a register of the debug adapter. The debug adapter may then modify the data value, for example by performing a logical or arithmetic operation on it. The debug adapter may test a register of the debug unit or core device and conditionally complete a debug command dependent on the result of the test. The debug adapter may test a register of the debug unit or core device and conditionally change the sequence of operation of the debug unit or core device in order to execute an alternative command or group of commands. For example, in a debug command sequence directed to flushing a cache, the debug adapter may read a cache line. Dependent on either the value or status of the read cache line, the debug adapter selects to perform one of moving on to read the next cache line, flushing the cache line and also the cache line in the next level of cache, and finishing the operation.

By the debug adapter performing the data manipulation instead of the debug controller, system latency is further reduced.

The methods described herein reduce latency involved in performing debugging operations. By decreasing the time it takes to perform debugging operations, bugs in system circuitry are detected and rectified more quickly, which improves the user experience of debugging procedures. By reducing the latency in the debugging operations, the debugging capability of the debugging circuitry is improved because the core devices are interrupted (for example stopped) for a shorter time period.

Each component of the SoCs illustrated in FIGS. 1 to 4 may be implemented in dedicated hardware. Alternatively, each component of the SoC illustrated in FIGS. 1 to 4 may be implemented in software. Some components may be implemented in software, whilst other components are implemented in dedicated hardware. Suitably, the debug agent is a software application and the debugger is implemented in hardware.

Suitably, debugging circuitry 101 including any debug units and communication interfaces are hardware circuits forming part of SoC 100. Preferably, debug units for controlling and/or monitoring complex core devices and peripherals such as processors use suitably complex state machines as part of their control unit. Suitably, communication interfaces use suitably complex state machines to implement their complex protocols. Various approaches to realising state machines are known. Such state machines can be realised using: (i) only logic gates; (ii) a combination of logic gates and memory, where the memory is used to contain tables of values to simplify the state machine's operation or to make it programmable; or (iii) a processor core to execute software stored in memory. Where a processor core is used it can be: (i) integral to the specific debug unit, communication interface, or other debugging circuitry; or (ii) shared between several debug units to reduce their implementation resources and cost.

The debug adapter may be implemented in hardware. In this case, dedicated hardware is used for each debugger operation. If the debugger operation interacts with the core device itself, and not just its associated debug unit, then the underlying implementation of the debugger operation is core device specific. In other words, the instructions sent from the debug adapter to the debug unit to, for example, read the state of the core device, is different for one core device to another. Thus, in this case, the hardware unit is specifically designed for that core device. By having the debug adapter implement the debugging operation in hardware, the operation of the debug controller is simplified to just providing high level instructions to the debug adapter. Alternatively, the debug adapter may comprise logic in hardware to perform the debug register accesses. In this case, the debug controller provides both high and low level instructions to the debug adapter. Alternatively, the debug adapter may comprise programmable logic in hardware. In this case, the debug controller provides instructions to the debug adapter as to how to perform the high level operations.

The SoC described is suitably incorporated within a computing-based device. The computing-based device may be an electronic device. Suitably, the computing-based device comprises one or more processors for processing computer executable instructions to control operation of the device in order to implement the methods described herein. The computer executable instructions can be provided using any computer-readable media such as a memory. The methods described herein may be performed by software in machine readable form on a tangible storage medium. Software can be provided at the computing-based device to implement the methods described herein. For example, the debug adapter may comprise polling logic to poll, receive poll responses, and analyse the poll responses in accordance with the methods described with reference to FIGS. 5, 6 and 7. The polling logic may also be configured to determine whether to poll the debug unit in accordance with the selective polling mechanisms described herein. The debug adapter may comprise manipulation logic to manipulate data values from the debug unit or core device as described herein.

Suitably, in the hardware implementation of the debug adapter, most or all of the debugger operations are performed at the debug adapter. Suitably, in the software implementation of the debug adapter, most debugger operations are performed by the debug agent of the debug controller, with the debug adapter performing the polling mechanisms described herein. Thus, in the software implementation, the debug agent is more complex.

The above description describes the system circuitry and debugging circuitry as being comprised on the same SoC. In an alternative implementation, the system circuitry and debugging circuitry are comprised across two or more integrated circuit chips of an MCM. In an MCM, the integrated circuit chips are typically stacked or located adjacently on an interposer substrate. Some system circuitry may be located on one integrated circuit chip and other system circuitry located on a different integrated circuit chip of the MCM. Similarly, the debugging circuitry may be distributed across more than one integrated circuit chip of the MCM. Thus, the method and apparatus described above in the context of an SoC also apply in the context of an MCM.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An integrated circuit chip comprising:
 system circuitry comprising a peripheral circuit;
 debugging circuitry comprising:
  a debug unit connected to the peripheral circuit; and
  a debug adapter configured to interface between the debug unit and a debug controller, and configured to:
   receive a sequence of debug commands from the debug controller, each debug command instructing the debug unit to perform an action other than responding to a poll; and
   in respect of each debug command:
    send the debug command to the debug unit; and
    poll the debug unit to query whether the debug unit has performed the action instructed in that debug command.

2. An integrated circuit chip as claimed in claim 1, the debug adapter further being configured to, in respect of each debug command:
 receive a poll response from the debug unit; and
 if that poll response indicates that the debug unit has performed the action, send the next debug command in the sequence of debug commands to the debug unit.

3. An integrated circuit chip as claimed in claim 1, the debug adapter further being configured to, in respect of each debug command:
 receive a poll response from the debug unit; and if that poll response indicates that the debug unit has not performed the action:
repeatedly poll the debug unit to query whether the debug unit has performed the action instructed in that debug command; and
on receiving a poll response indicating that the debug unit has performed the action, send the next debug command in the sequence of debug commands to the debug unit.

4. An integrated circuit chip as claimed in claim 1, the debug adapter comprising a buffer, the debug adapter being configured to:
store the sequence of debug commands in the buffer; and
in respect of each debug command, on receiving a poll response from the debug unit indicating that the debug unit has performed the action, extract the next debug command in the sequence of commands from the buffer for transmittal to the debug unit.

5. An integrated circuit chip as claimed in claim 1, the debug adapter being configured to receive the sequence of debug commands in a single communication from the debug controller.

6. An integrated circuit chip as claimed in claim 1, the debug adapter comprising a memory, the debug adapter being configured to:
prior to debugging the system circuitry, receive sequences of debug commands from the debug controller to be pre-loaded to the memory;
pre-load the sequences of debug commands to the memory;
subsequently receive an instruction from the debug controller to execute a pre-loaded debug command sequence; and
extract that pre-loaded debug command sequence from the memory and send the debug commands of that pre-loaded debug command sequence to the debug unit.

7. An integrated circuit chip as claimed in claim 6, the debug adapter being configured to:
whilst debugging the system circuitry, receive a memory update from the debug controller comprising a further debug command sequence to be loaded to the memory;
load the further debug command sequence to the memory; and
on receiving an instruction from the debug controller to execute the further debug command sequence, extract the further debug command sequence from the memory and send the debug commands of that further debug command sequence to the debug unit.

8. An integrated circuit chip as claimed in claim 1, the debug adapter comprising a register, the debug adapter being configured to read a data value from the debug unit and store the data value in the register.

9. An integrated circuit chip as claimed in claim 8, the debug adapter being further configured to perform a logical or arithmetic operation on the data value.

10. An integrated circuit chip as claimed in claim 8, the debug adapter being further configured to select a further debug command to send to the debug unit in dependence on the data value.

11. An integrated circuit chip as claimed in claim 1, the debug adapter being further configured to selectively poll the debug unit to query whether the debug unit has performed the action instructed in the debug command in dependence on the debug command type.

12. An integrated circuit chip as claimed in claim 11, wherein the debug adapter is configured to select not to poll the debug unit following sending a debug command which the debug unit is configured to respond to by sending data to the debug controller.

13. A method of debugging an integrated circuit chip, the integrated circuit chip comprising system circuitry and debugging circuitry, the system circuitry comprising a peripheral circuit, and the debugging circuitry comprising a debug unit and a debug adapter, the debug unit connected to the peripheral circuit, the debug adapter configured to interface between the debug unit and a debug controller, the method comprising, at the debug adapter:
receiving a sequence of debug commands from the debug controller, each debug command instructing the debug unit to perform an action other than responding to a poll; and
in respect of each debug command:
sending the debug command to the debug unit; and
polling the debug unit to query whether the debug unit has performed the action instructed in that debug command.

14. A method as claimed in claim 13, further comprising, in respect of each debug command:
receiving a poll response from the debug unit; and
if that poll response indicates that the debug unit has performed the action, sending the next debug command in the sequence of debug commands to the debug unit.

15. A method as claimed in claim 13, further comprising, in respect of each debug command:
receiving a poll response from the debug unit; and
if that poll response indicates that the debug unit has not performed the action:
repeatedly polling the debug unit to query whether the debug unit has performed the action instructed in that debug command; and
on receiving a poll response indicating that the debug unit has performed the action, sending the next debug command in the sequence of debug commands to the debug unit.

16. A method as claimed in claim 13, further comprising:
storing the sequence of debug commands in a buffer; and
in respect of each debug command, on receiving a poll response from the debug unit indicating that the debug unit has performed the action, extracting the next debug command in the sequence of commands from the buffer for transmittal to the debug unit.

17. A method as claimed in claim 13, further comprising receiving the sequence of debug commands in a single communication from the debug controller.

18. A method as claimed in claim 13, further comprising:
prior to debugging the system circuitry, receiving sequences of debug commands from the debug controller to be pre-loaded to a memory;
pre-loading the sequences of debug commands to the memory;
subsequently receiving an instruction from the debug controller to execute a pre-loaded debug command sequence; and
extracting that pre-loaded debug command sequence from the memory and sending the debug commands of that pre-loaded debug command sequence to the debug unit.

19. A method as claimed in claim 18, comprising:
whilst debugging the system circuitry, receiving a memory update from the debug controller comprising a further debug command sequence to be loaded to the memory;
loading the further debug command sequence to the memory; and on receiving an instruction from the debug controller to execute the further debug command sequence, extracting the further debug command sequence from the memory and sending the debug commands of that further debug command sequence to the debug unit.

20. A method as claimed in claim 13, comprising, at the debug adapter, reading a data value from the debug unit and storing the data value in the register.

* * * * *

UNITED STATES PATENT AND TRADEMARK OFFICE
CERTIFICATE OF CORRECTION

PATENT NO. : 10,088,523 B2  Page 1 of 1
APPLICATION NO. : 15/235308
DATED : October 2, 2018
INVENTOR(S) : Andrew Brian Thomas Hopkins, Andrew James Bower and Michael Jonathan Thyer It is certified that error appears in the above-identified patent and that said Letters Patent is hereby corrected as shown below:

On the Title Page

Column 2, Item (56) Other Publications, Line 1, delete "UKk" insert -- UK --.

Signed and Sealed this
Eleventh Day of December, 2018

Andrei Iancu
*Director of the United States Patent and Trademark Office*